United States Patent [19]

Ishiwata et al.

[11] Patent Number: 4,737,730

[45] Date of Patent: Apr. 12, 1988

[54] PEAK DETECTOR CIRCUIT FOR FM MEASURING APPARATUS

[75] Inventors: Makoto Ishiwata; Masayoshi Asai, both of Tokyo, Japan

[73] Assignee: Ando Electric Co., Ltd., Tokyo, Japan

[21] Appl. No.: 887,306

[22] Filed: Jul. 21, 1986

[30] Foreign Application Priority Data

Jul. 22, 1985 [JP] Japan ............................ 60-112133[U]

[51] Int. Cl.$^4$ .......................... H03D 1/10; H03K 5/24
[52] U.S. Cl. ..................................... 329/203; 328/117; 328/135
[58] Field of Search ................ 329/203; 328/115, 116, 328/117, 135, 151; 307/351

[56] References Cited

U.S. PATENT DOCUMENTS 3,508,158 4/1970 Marchese ............................ 328/117
4,432,235 2/1984 Renzel et al. .................... 328/115 X Primary Examiner—Eugene R. Laroche
Assistant Examiner—David Mis
Attorney, Agent, or Firm—Seidel, Gonda, Goldhammer & Abbott

[57] ABSTRACT

A peak detector circuit comprises a peak detecting diode circuitry for detecting peaks in an input FM demodulated signal, a capacitor connected to the output of the diode circuitry, a first resistor connected in parallel with the capacitor, and an amplifier connected to the output of the diode circuitry and having a high input impedance. A second resistor is connected to the first resistor in parallel therewith through a turn-on/off switch for discharging and subsequently charging the capacitor within a short time in response to detection of decreasing in the level of the input FM demodulated signal.

4 Claims, 3 Drawing Sheets

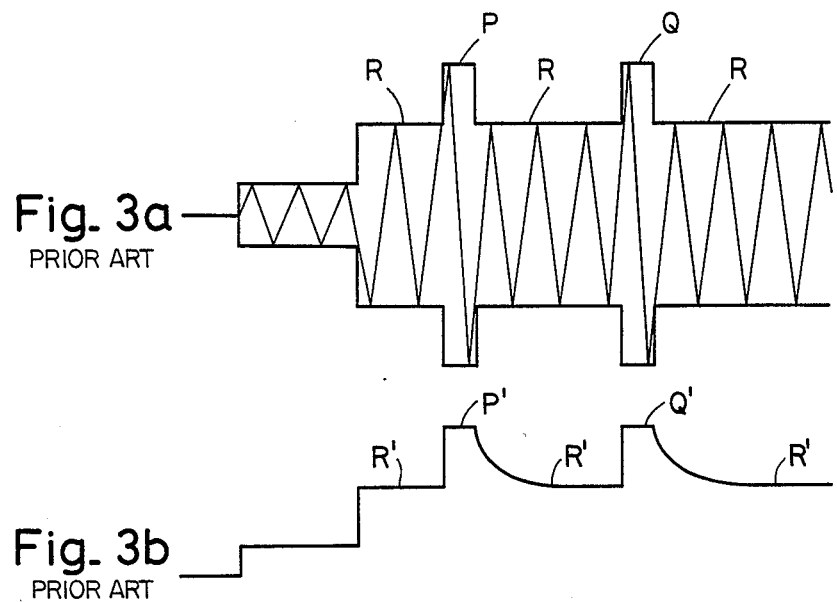
Fig. 3a PRIOR ART
Fig. 3b PRIOR ART
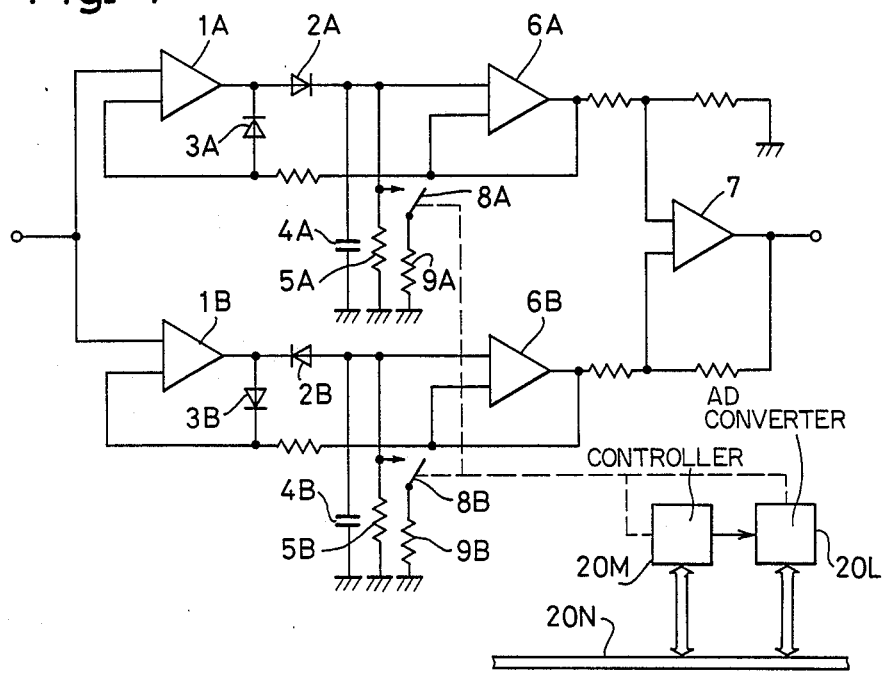
Fig. 4

PEAK DETECTOR CIRCUIT FOR FM MEASURING APPARATUS

BACKGROUND OF THE INVENTION

1. Field of the Invention

The present invention concerns with an improvement of a peak detector circuit designed for use in an FM (frequency modulation) measuring instrument or apparatus to measure frequency transitions.

2. Description of the Prior Art

For having a better understanding of the invention, the related prior art will be described in some detail by referring to FIG. 1 of the accompanying drawings which shows in a schematic circuit diagram a measuring system including an FM transmitter denoted generally by a reference numeral 10 and an FM measuring apparatus denoted by 20. The FM measuring apparatus 20 is composed of a local oscillator 20A, a converter or mixer 20B, a limiter 20C, an FM detector 20D, a level regulator 20E, a peak detector circuit 20F, an indicator 20G, a low frequency oscillator 20H and a second level regulator 20K connected in the manner as shown. As will be seen, the FM measuring apparatus 20 is a sort of FM receiver which is so arranged as to measure the modulation characteristics and others of the FM transmitter 10. To this end, the latter is connected to an FM modulation exciting source constituted by the low frequency oscillator 20H and the level regulator 20K incorporated in the FM measuring apparatus 20. On the other hand, the FM measuring apparatus 20 receives an FM signal from the FM transmitter 10, which signal is demodulated by the FM detector 20D. The peak detector circuit 20F detects the peak value of the demodulated signal, the detected demodulated signal being applied to the indicator 20G. In this way, the modulation frequency characteristics and the like of the FM transmitter 10 can be measured.

FIG. 2 shows a hitherto known circuit arrangement of the peak detector circuit 20F used in the system shown in FIG. 1. Referring to FIG. 2, a reference character 1A denotes an amplifier, 2A and 3a denote diodes, respectively, 4a denotes a capacitor, 5A denotes a resistor, 6A denotes an amplifier and 7 denotes an adder. Reference characters 1B to 6B denote same circuit elements as those designated by 1A to 6A, respectively. It should however be noted that the diodes 2B and 3B are connected with the polarities opposite to those of the diodes 2A and 3A, respectively. Consequently, the input signal to the peak levels circuit 20F shown in FIG. 2 is detected in respect to the peak levels of both negative and positive polarities. In this connection, it is to be mentioned that the input signal to the peak detector circuit shown in FIG. 2 may include a wide band signal such as a signal having an extended period and an impulse-like shot signal. In order to assure a high measuring accuracy even in such case, the charging time of the capacitor 4A is required to be shortened. To this end, the capacitor 4A is usually selected to have a small value, while the amplifier 6A connected to the capacitor 4A for holding a charging voltage across the capacitor is designed to exhibit a high input impedance.

FIG. 3 of the accompanying drawings shows waveform diagrams for illustrating relationship between the input signal and the output signal of the peak detector circuit 20F of the circuit configuration shown in FIG. 2. More specifically, the waveform of the input signal to the peak detector circuit is illustrated at (a), while that of the output signal thereof is shown at (b). As will be seen, the input signal (a) has peaks P and Q having greater instantaneous values relative to a steady level R. These peaks make appearance as peaks P' and Q' in the output signal waveform (b). A will be seen in the waveform (b), although the peak detector circuit can make rapid response to the rising edge of the peaks in the input signal (a), remarkable delay is involved in following the falling edge of the peak of the input signal to reach the steady level R'. This can be explained by the fact that the capacitor 4A is discharged trough the amplifier 6A having the high input impedance.

The time lag involved in the restoring of the output signal to the steady level R' in response to the falling edge of the peak in the input signal is accompanied with problems mentioned below.

When the frequency transition of the FM transmitter 10 is to be measured for the purpose of calibration or the like, the FM transmitter 10 is excited from the low frequency oscillator 20H through the level regulator 20K for controlling the FM modulation thereof. The FM signal produced by the FM transmitter 10 is received by the FM measuring apparatus 20 to be displayed by the indicator 20G. In this connection, it is noted that when the frequency transition or change of the FM signal is effected stepwise so as to step a desired value by consulting or observing the information given by the indicator 20G, a lot of time will be taken until coincidence is established between the desired value and the one display by the indicator 20G because of the significant time lag involved in the output signal of the peak detector circuit 20F in following up the decreasing in the level of the input signal thereto, as described above by referring to FIG. 3, which in turn means that the measurement is very time-consuming, giving rise to a problem.

SUMMARY OF THE INVENTION

It is therefore an object of the present invention to improve the peak detector circuit (20F) so that the output thereof can follow up even the rapid decreasing in the level of the input signal thereto without any appreciable delay and to provide an FM measuring apparatus which is immune to the problem described above.

In view of the above and other objects which will become apparent as description proceeds, there is provided according to a general aspect of the present invention a peak detector circuit for an FM measuring apparatus which comprises at least a peak detector diode circuitry for detecting peaks in an input FM demodulated signal, a capacitor connected to the output of the diode circuitry, a resistor connected in parallel with the capacitor and an amplifier also connected to the output of the diode circuitry and having a high input impedance, wherein a second resistor is connected in parallel with the first mentioned resistor through a turn on-off switch for discharging and charging immediately subsequently the capacitor within a shortened time in response to detection of decreasing in the level of the FM demodulated signal inputted to the peak detector circuit.

These and other advantages and attainments of the present invention will become apparent to those skilled in the art upon a reading of the following detailed description when taken in conjunction with the drawings wherein there is shown an exemplary embodiment of the invention.

BRIEF DESCRIPTION OF THE DRAWINGS

FIGS. 3(a) to 3(b) is a waveform diagram for illustrating relationship between the input signal and output signal of the peak detector circuit shown in FIG. 2;

FIG. 4 is a circuit diagram showing an embodiment of the peak detector circuit according to the present invention.

DESCRIPTION OF THE PREFERRED EMBODIMENTS

Figure 2:
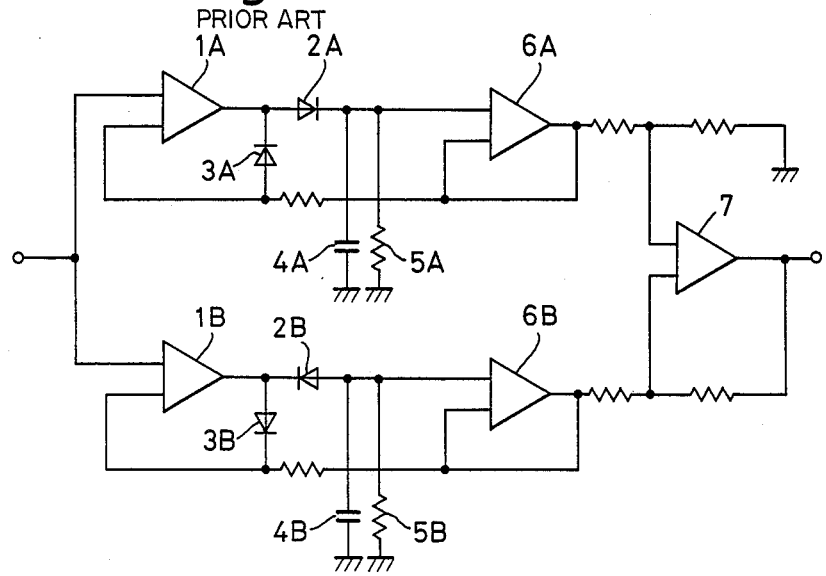
FIG. 2 is a circuit diagram showing a hitherto known peak detector circuit.

FIG. 4 shows a circuit arrangement of the peak detector circuit according to an exemplary embodiment of the present invention. In the figure, the circuit elements corresponding to those shown in FIG. 2 are designated by same reference characters and repeated description thereof is omitted. Referring to FIG. 4, reference characters 8A and 8B denote switches, and 9A and 9B denote resistors, respectively. The switches 8A and 8B are turned on/off in response to a control signal supplied over a bus 20N to which there are connected an A/D converter 20L and a controller 20M for controlling the switches 8A and 8B. The controller 20M is so configured to trigger the on/off operation of the switches 8A and 8B instantaneously upon occurrence of the decreasing in the output of the A/D converter 20L.

The operation of the switches 8A and 8B will be described below by referring to the waveform diagrams shown in FIGS. 5(a) to 5(d).

Figure 1:
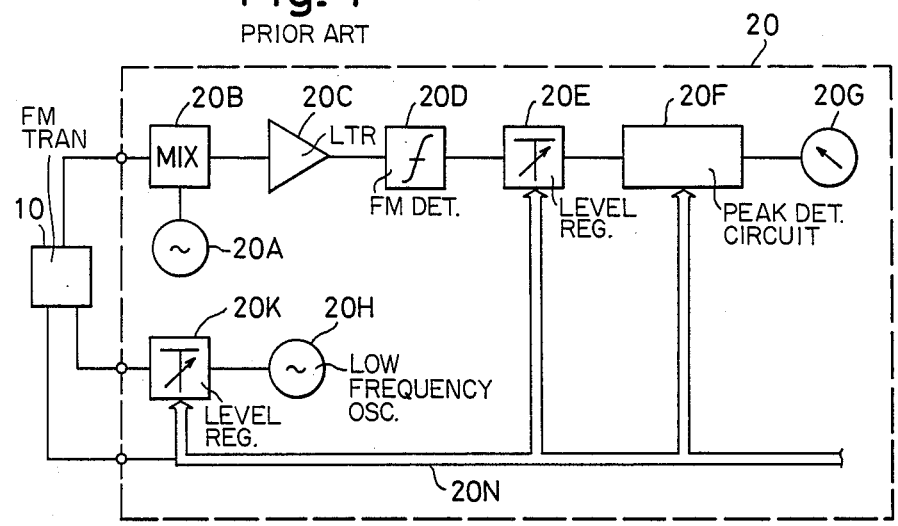
FIG. 1 is a block diagram showing a measuring system including an FM transmitter and an FM measuring apparatus.
Figure 5A:
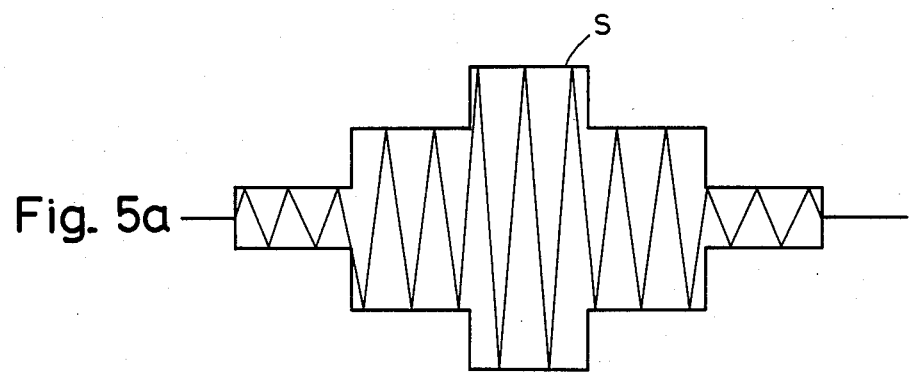
FIGS. 5(a) to 5(d) are signal waveform diagrams for illustrating operation of the peak detector circuit according to the invention.

FIG. 5(a) shows a waveform of the control signal set by the level regulators 20E and 20K shown in FIG. 1, by way of example. As will be seen, the demodulated signal is increased stepwise and also decreased stepwise upon attainment of the level of a set value S.

Figure 5B:
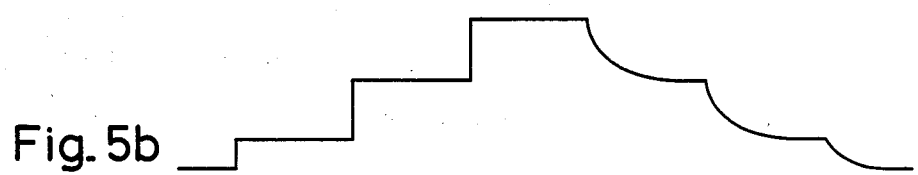

FIG. 5(b) shows a signal waveform outputted from the hitherto known peak detector circuit shown in FIG. 2 in response to the signal waveform shown in FIG. 5(a) inputted thereto. As will be seen, although the detected or outputted waveform follows up the envelope of the input waveform with fidelity in case the input signal is increasing or rising, the detected waveform undergoes distortion (i.e. gentle decreasing or falling) when the input signal is decreased for the reason described hereinbefore.

Figure 5C:
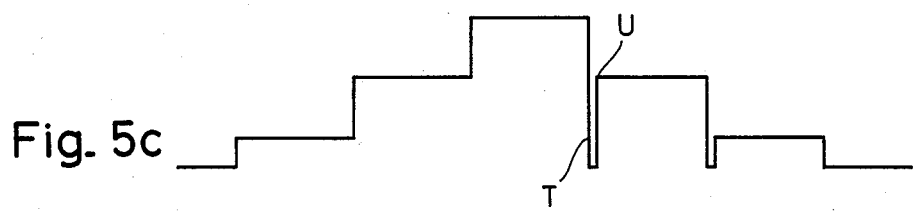

In contrast, FIG. 5(c) shows a signal waveform which can be obtained through detection of the waveform shown in FIG. 5(a) by the peak detector circuit according to the present invention shown in FIG. 4. As will be seen from comparison of the waveform shown in FIG. 5(c) with that of FIG. 5(b), both the waveforms remain identical until the input signal has attained the set level S. However, in the case of the peak level detector circuit according to the invention, the controller 20M causes the switches 8A and 8B to be instantaneously turned on/off upon occurrence of decreasing in the level of the input signal. When the switches 8A and 8B are turned on, the resistors 9A and 9B are connected in parallel with the resistors 5A and 5B, respectively, with the result that the capacitors 4A and 4B are forced to be discharged rapidly. As a consequence, the detection output becomes zero, as indicated at T in FIG. 5(c).

The switches 8A and 8B are subsequently turned on immediately after the turn-off operation under the command of the controller 20M, resulting in that the output waveform of the peak detector circuit according to the invention rises up to the instantaneous peak level within a short time, as indicated at U in FIG. 5(c).

Figure 5D:

FIG. 5(d) shows a waveform of the control signal supplied over the bus 20N for controlling the switch operation mentioned above. The control signal is produced upon every decreasing of the input waveform shown in FIG. 5(a).

As will be seen from the waveform shown in FIG. 5(c), the output waveform produced by the peak detector circuit according to the present invention follows up the peak waveform of the input signal with an improved fidelity even in the phase in which the input peak level is decreased stepwise.

As will now be appreciated from the foregoing description, there has been provided according to the invention an improved peak detector circuit which is capable of following up the input peak waveform with an enhanced fidelity by virtue of such arrangement that the capacitors (4A,4B) are forced to be rapidly discharged upon decreasing in the input peak level and again charged immediately thereafter. Thus, the intended measurement can be accomplished within a short time when the frequency transition of an FM transmitter is to be measured or when the indicator of the FM measuring instrument is to be calibrated.

It is thought that the present invention and many of its attendant advantages will be understood from the foregoing description, and it will be apparent that various changes may be made in the form, construction and arrangement of the parts described herein without departing from the spirit and scope of the invention or sacrificing all of its material advantages, the form hereinbefore described being merely a preferred or exemplary embodiment thereof.

We claim:

1. A peak detector circuit, comprising peak detecting diode circuitry for detecting peaks in an FM demodulated signal to said peak detector circuit, a capacitor connected to the output of said diode circuitry, and an amplifier connected to the output of said diode circuitry and having a high input impedance, discharging means connected in parallel with said capacitor for effecting rapid discharging of said capacitor within a shortened time and means for actuating said discharging means in response to a decrease in the level of said FM demodulated signal.

2. A peak detector circuit according to claim 1, wherein said capacitor is again charged rapidly immediately after said rapid discharging.

3. A peak detector circuit according to claim 1, wherein said discharging means includes a resistor and a switch in series, said switch being first turned on and then immediately thereafter turned off in response to a decrease in the peak level of said FM demodulated signal.

4. A peak detector circuit according to claim 3, wherein a pair of channels each including said diode circuitry, said capacitor, said resistor, said switch and said amplifier are provided in parallel with each other, the outputs of said channels being combined through an adder, the diodes of one channel being connected with a polarity opposite to that of the diodes belonging to the other channel so that the peak level of either positive or negative polarities can be detected.

* * * * *